United States Patent
Kwak

(10) Patent No.: US 8,013,273 B2
(45) Date of Patent: Sep. 6, 2011

(54) METHOD FOR MANUFACTURING ABSORPTION PAD

(75) Inventor: Nho-Kwon Kwak, Incheon (KR)

(73) Assignee: Hanmi Semiconductor, Inc., Incheon (KR)

( * ) Notice: Subject to any disclaimer, the term of this patent is extended or adjusted under 35 U.S.C. 154(b) by 1076 days.

(21) Appl. No.: 11/796,000

(22) PCT Filed: Jan. 26, 2006

(86) PCT No.: PCT/KR2006/000309
§ 371 (c)(1),
(2), (4) Date: Jul. 25, 2007

(87) PCT Pub. No.: WO2006/080815
PCT Pub. Date: Aug. 3, 2006

(65) Prior Publication Data
US 2009/0120918 A1    May 14, 2009

(30) Foreign Application Priority Data

Jan. 28, 2005  (KR) ...................... 10-2005-0007947
Jul. 25, 2005  (KR) ...................... 10-2005-0067293

(51) Int. Cl.
*B23K 26/38*   (2006.01)
(52) U.S. Cl. .................................. 219/121.71; 700/166
(58) Field of Classification Search ............. 219/121.68, 219/121.69, 121.7, 121.71; 700/166
See application file for complete search history.

(56) References Cited

U.S. PATENT DOCUMENTS

| 4,970,600 A * | 11/1990 | Garnier et al. ........... 219/121.68 |
| 5,246,530 A * | 9/1993 | Bugle et al. .............. 219/121.69 |
| 5,334,816 A | 8/1994 | Sugiyama |
| 5,477,023 A | 12/1995 | Schneider et al. |
| 6,184,972 B1 | 2/2001 | Mizutani et al. |
| 6,290,695 B1 | 9/2001 | Kuhnert et al. |
| 6,346,687 B1 * | 2/2002 | Kinoshita et al. ........ 219/121.61 |

FOREIGN PATENT DOCUMENTS

| JP | 5-42653 A | * | 2/1993 |
| JP | 05-212568 | | 8/1993 |
| JP | 7-16771 A | * | 1/1995 |
| JP | 9-16238 A | * | 1/1997 |

(Continued)

OTHER PUBLICATIONS

Machine translation of Japan Patent No. 2000-52,075-A, Dec. 2010.*

(Continued)

*Primary Examiner* — Geoffrey S Evans
(74) *Attorney, Agent, or Firm* — Sherr & Vaughn, PLLC

(57) ABSTRACT

Disclosed are an apparatus and a method for manufacturing an absorption pad used for picking up a package or a strip during a semiconductor manufacturing process. The apparatus includes a workpiece transfer device on which a workpiece is mounted, a laser generator installed above the workpiece transfer device while being spaced apart from the workpiece transfer device by a predetermined distance, a driving unit for moving the workpiece transfer device and the laser generator relative to each other, and a controller for controlling the laser generator. It is possible to precisely form patterns having various sizes and shapes according to use of the absorption pad and the size of the package. Processing conditions for the workpiece are standardized, so that the processing time and manufacturing cost for the absorption pad are minimized.

9 Claims, 7 Drawing Sheets

FOREIGN PATENT DOCUMENTS

| | | | |
|---|---|---|---|
| JP | 10-536 A | * | 1/1998 |
| JP | 11-58062 A | * | 3/1999 |
| JP | 2000-052075 | | 2/2000 |
| JP | 2000-52075 A | * | 2/2000 |
| JP | 2000-100895 | | 4/2000 |
| JP | 2004-344931 | | 9/2004 |
| KR | 10-1999-0071369 | | 9/1999 |
| KR | 10-2002-0038134 | | 5/2002 |

OTHER PUBLICATIONS

Machine translation of Japan Patent No. 7-16,771, Dec. 2010.*

* cited by examiner

[Fig. 1]
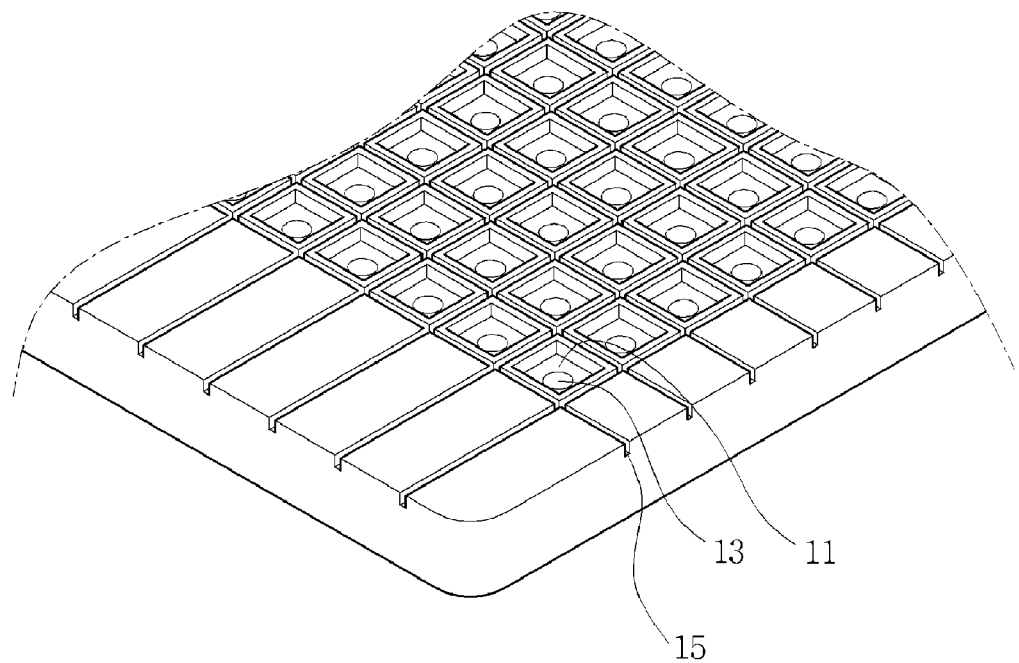
[Fig. 2]
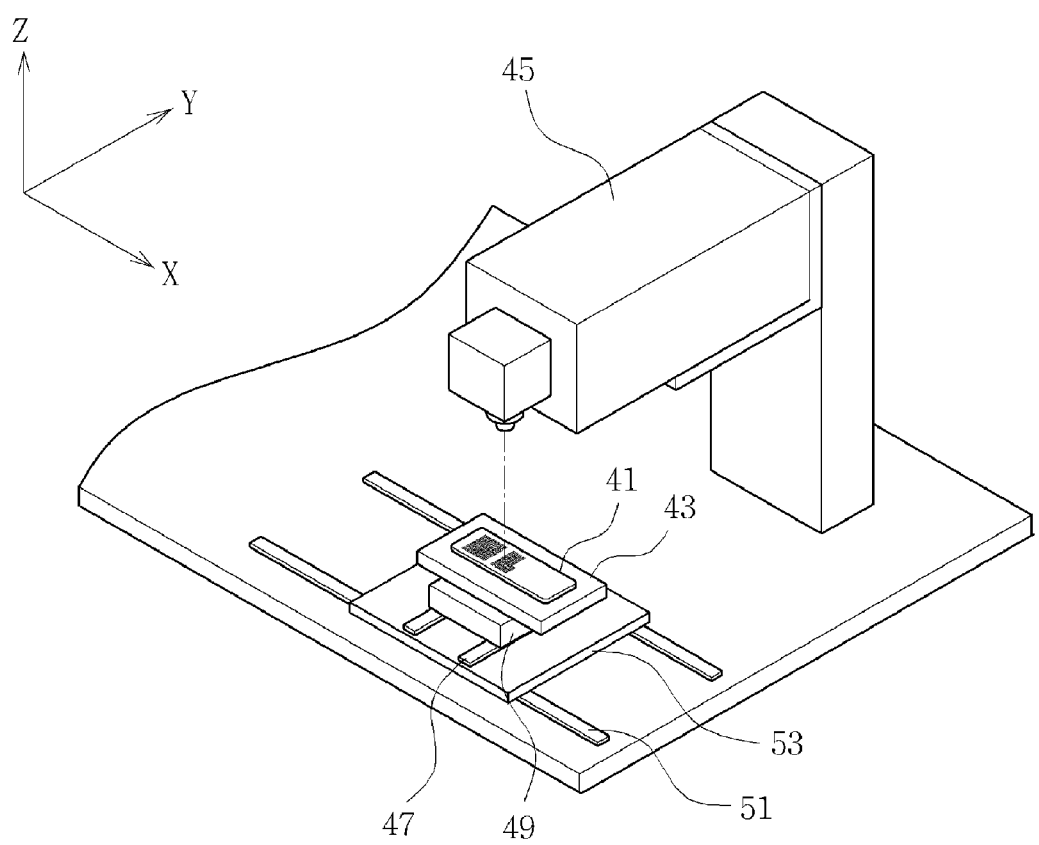

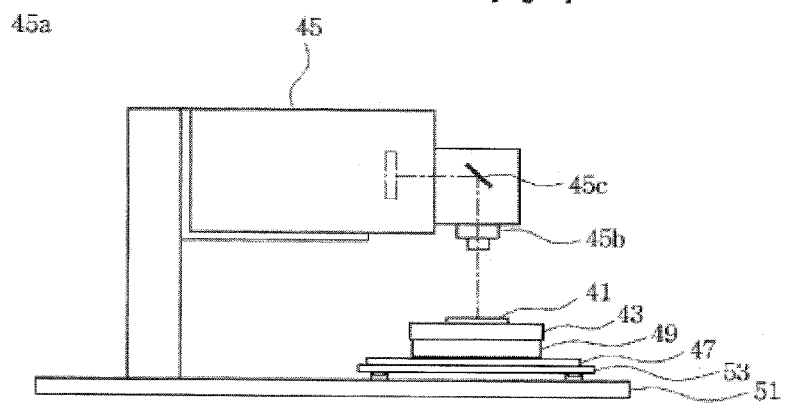
[Fig. 3]
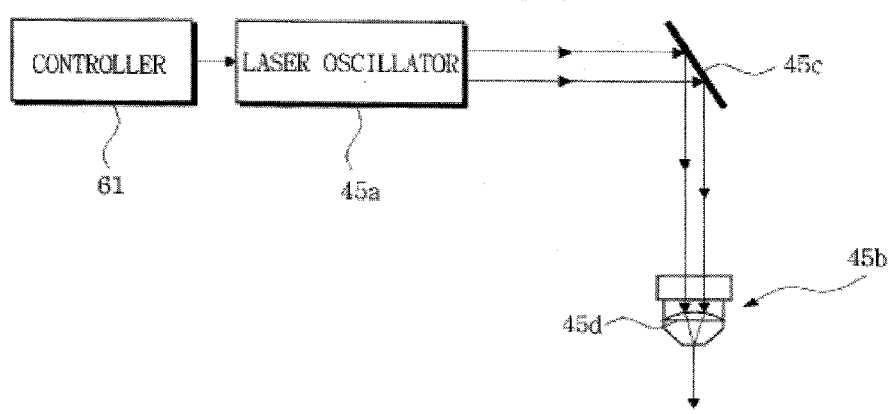
[Fig. 4]
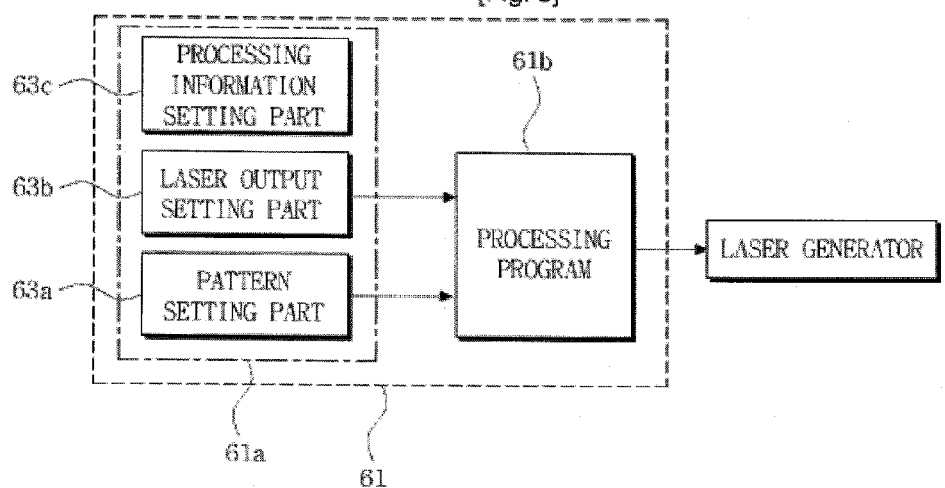
[Fig. 5]

[Fig. 6]
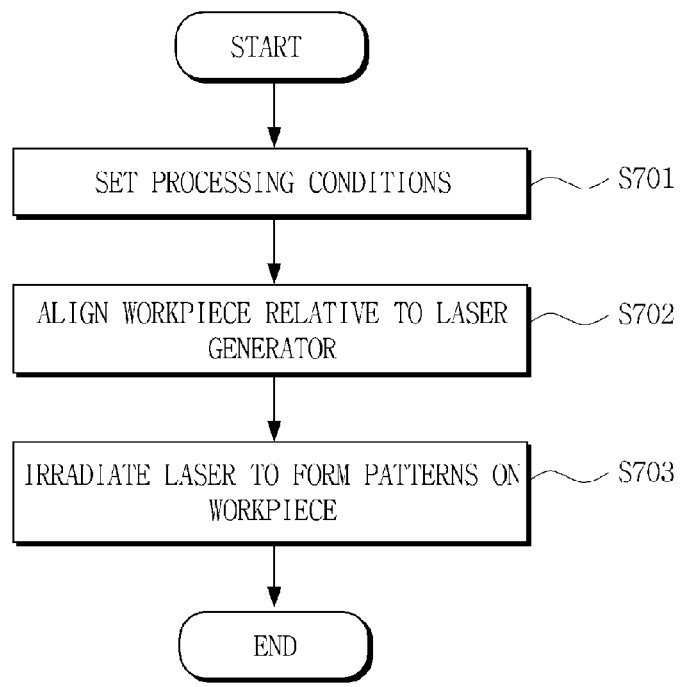
[Fig. 7]
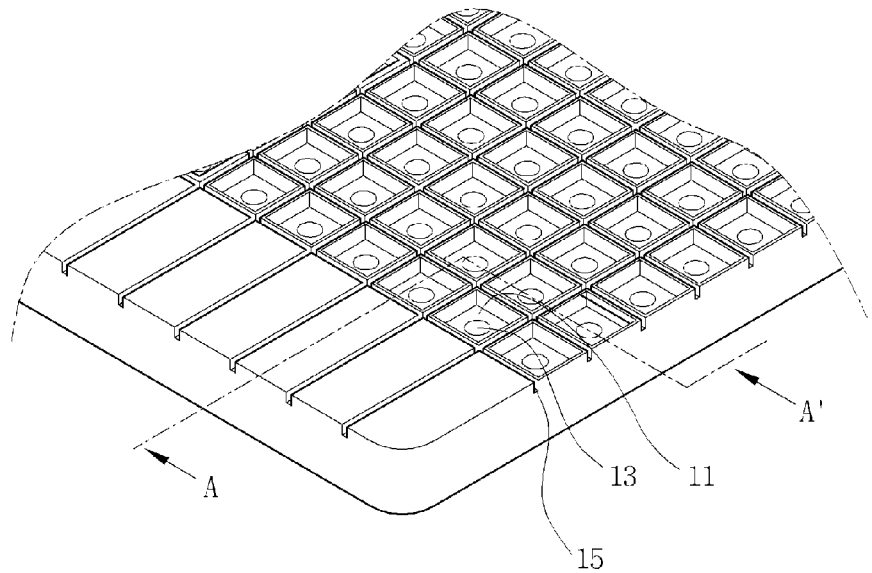
[Fig. 8]
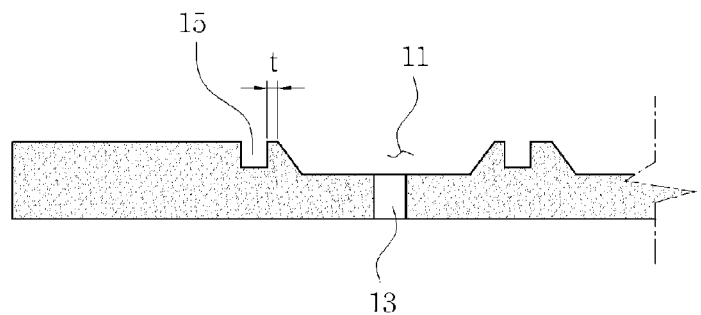

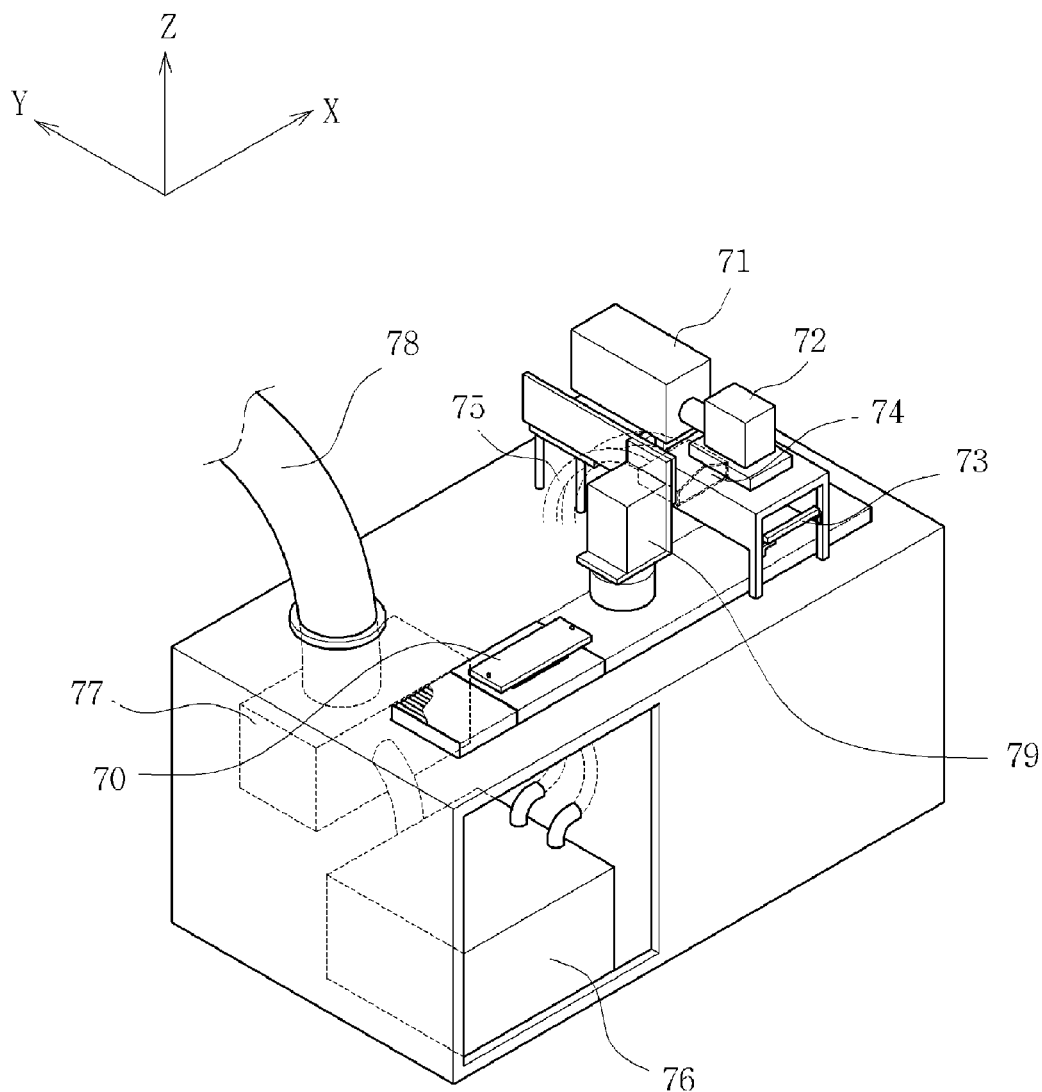
[Fig. 9]

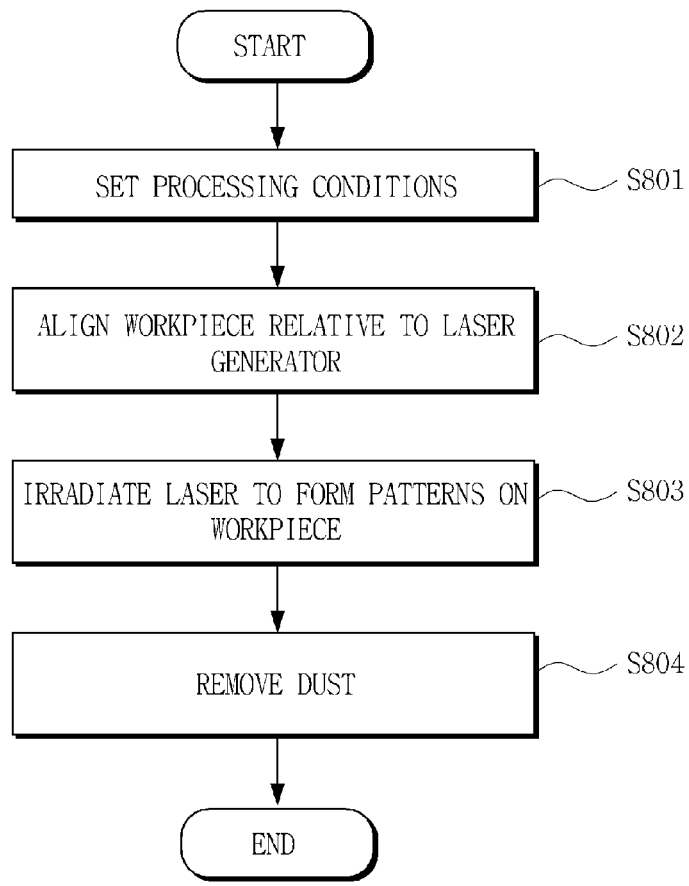
[Fig. 10]
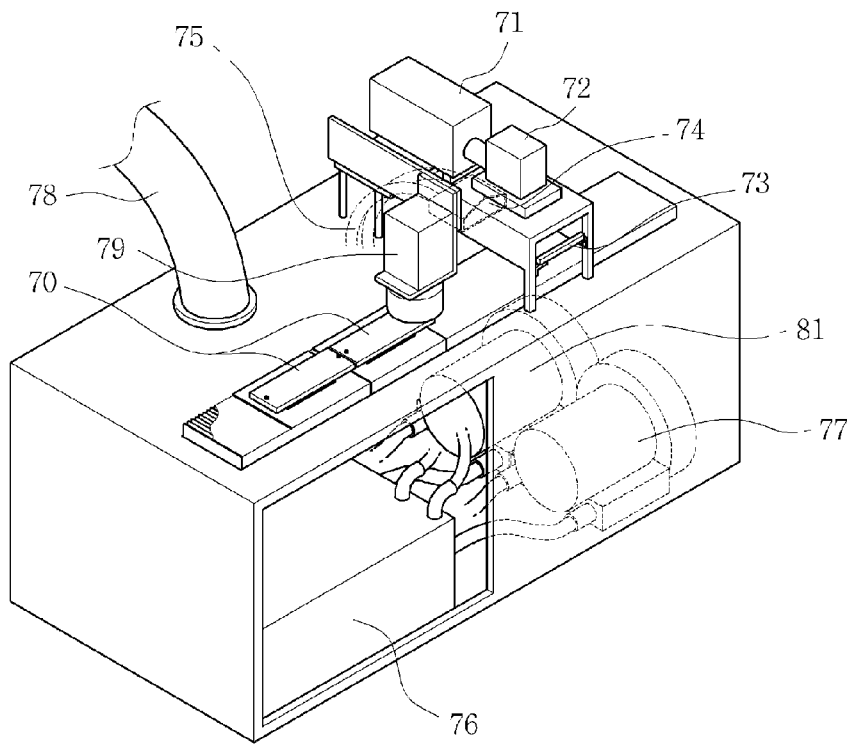
[Fig. 11]

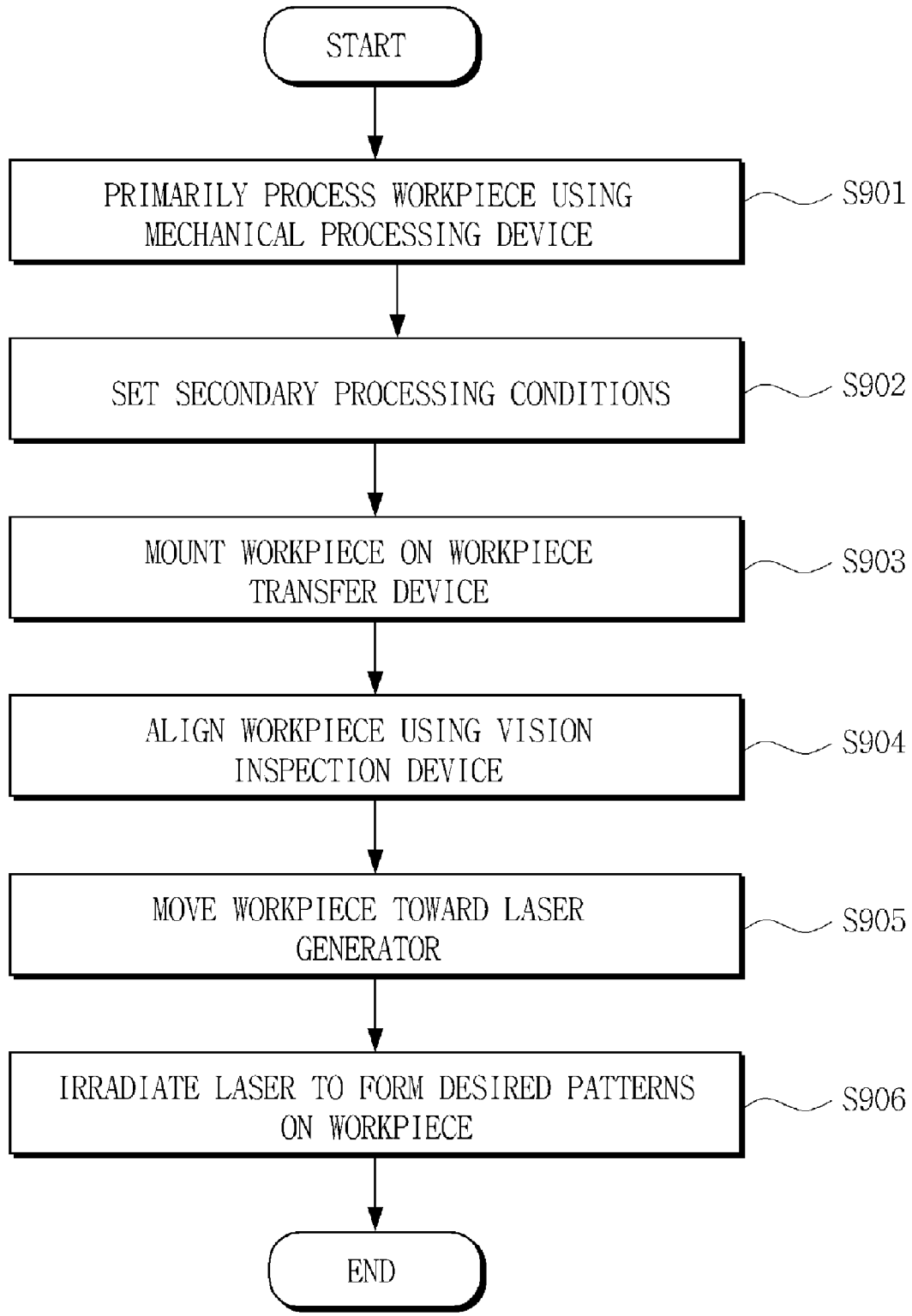
[Fig. 12]

[Fig. 13]
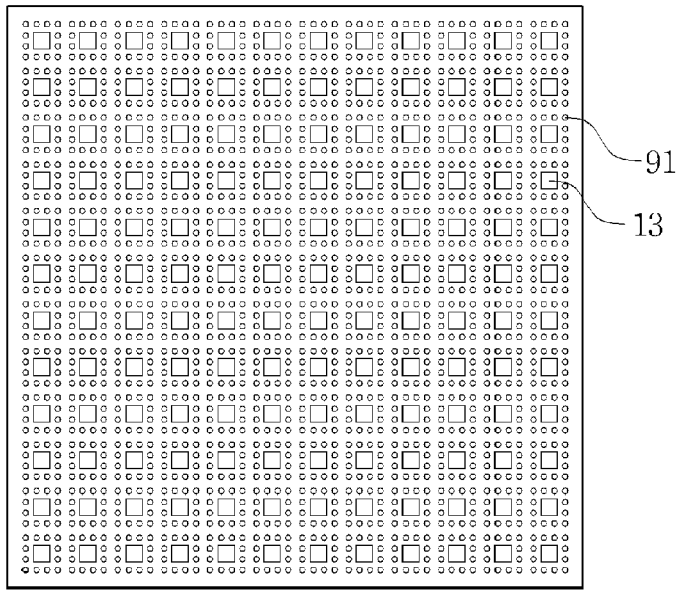
[Fig. 14]
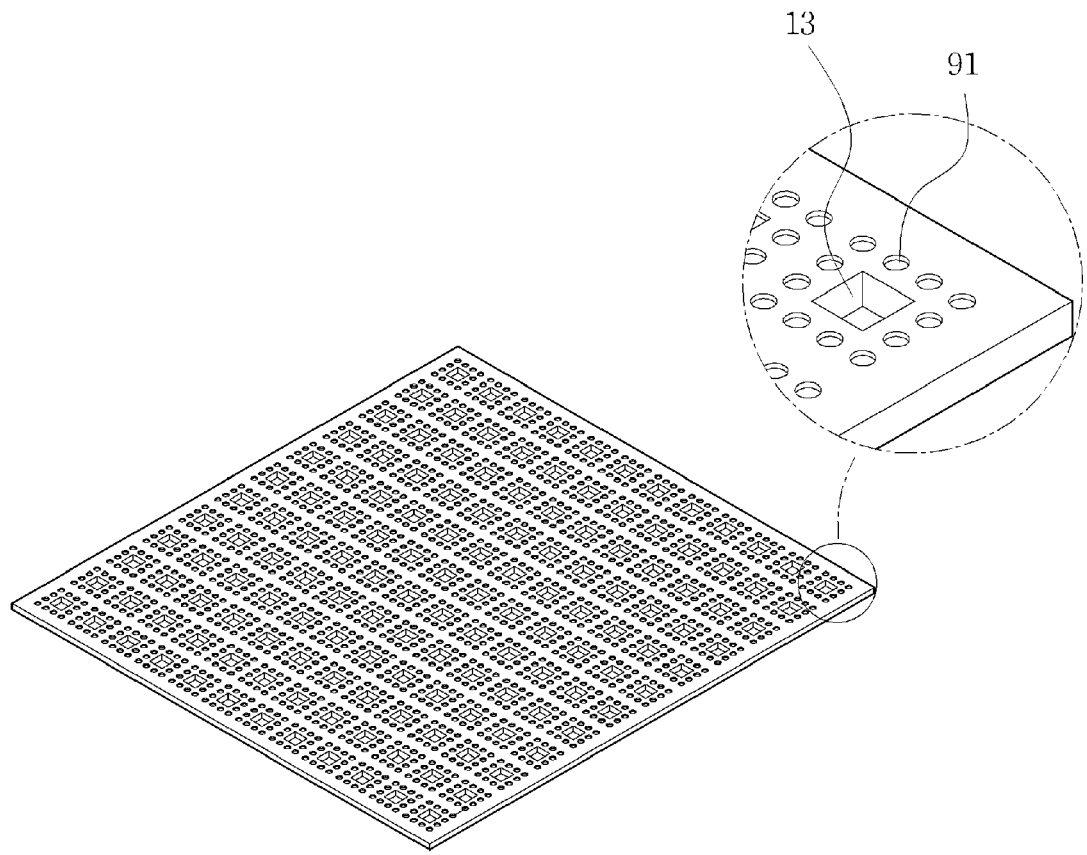

METHOD FOR MANUFACTURING ABSORPTION PAD

BACKGROUND OF THE INVENTION

1. Field of the Invention

The present invention relates to an apparatus and a method for manufacturing an absorption pad used for picking up a semiconductor package or a strip during a semiconductor manufacturing process.

2. Related Prior Art

In general, a semiconductor manufacturing process is mainly divided into a fabrication process and an assembly process. During the fabrication process, integrated circuits are designed on a silicon wafer, thereby forming a semiconductor chip. In addition, during the assembly process, a package strip is fabricated by sequentially performing various steps of attaching the semiconductor chip to a lead frame, electrically connecting the semiconductor chip to the lead frame using wires (or forming a solder ball), and molding the semiconductor chip with resin, such as epoxy.

Such a package strip is mounted on a workpiece transfer section of a sawing machine and a vacuum force is applied to the package strip so as to secure the package strip onto the workpiece transfer section. Then, the package strip is transferred to a dicing device, so that the dicing device dices the package strip into individual packages by using a rotating blade. The individual packages are transferred to another place, such as a package stacker, by means of a transfer picker. The workpiece transfer section and the transfer picker are provided with absorption pads, which pick up the package strip or the individual package by using a vacuum.

The present invention is not only applicable for such an absorption pad of the sawing machine, but also applicable for absorption pads used in Pick & Place equipment and various semiconductor manufacturing devices. For the purpose of convenience, the present invention will be described while forcing on the absorption pad used in the sawing machine.

According to one of methods for fabricating the absorption pad, rubber is inputted into a mold and heat and pressure are applied to the mold. Hereinafter, description will be made in relation to the absorption pad fabricated through the above method with reference to FIG. 1.

FIG. 1 is a view illustrating the absorption pad used for picking up a semiconductor package. The absorption pad includes a plurality of package absorption cavities 11 in the form of a matrix. A vacuum hole 13 is formed at the center portion of each package absorption cavity 11. The package absorption cavities 11 are defined by recesses 15 having predetermined depths for receiving rotating blades used for dicing the semiconductor package. In a state in which a package strip is mounted on the absorption pad, if the rotating blades are rotated until the rotating blades are accommodated in the recesses 15 within a predetermined depth, the package strip is diced into individual packages.

Such a process for dicing the package strip into individual packages is carried out by means of a sawing machine. The sawing machine employs the absorption pad so as to prevent the package strip from being damaged when the sawing machine picks up the package strip by using a vacuum. In addition, the absorption pad is also attached to a picker used for transferring the package strip to the sawing machine or transferring the individual packages from the sawing machine to another place, such as a package stacker. In order to fabricate the absorption pad, rubber is inputted into the mold and heat and pressure are applied to the mold.

SUMMARY OF THE INVENTION

However, the above method causes excessive cost and time consumption because a mold must be separately fabricated corresponding to the type and the shape of the absorption pad to be fabricated.

In addition, when the absorption pad fabricated through the above method is detached from the mold, the temperature of the absorption pad may be suddenly dropped down, so that the absorption pad is shrunk due to the characteristic of rubber. In this case, the size of each package absorption cavity may be reduced or the package absorption cavities may be deformed. Of course, in order to prevent the above problem, the mold can be fabricated in a relatively large size by taking the shrinkage of rubber into consideration. However, this may degrade the quality of the absorption pad in view of precision. In particular, when considering the current tendency that the size of the semiconductor package has been gradually reduced due to high integration of the semiconductor package, the above method is not suitable for fabricating an absorption pad requiring high precision in vacuum holes or package absorption cavities.

The present invention has been made in view of the above-mentioned problems, and it is an object of the present invention to provide an apparatus and a method for manufacturing an absorption pad used for a semiconductor manufacturing process, capable of precisely manufacturing the absorption pad, which is used in package transferring and dicing processes, by using a laser.

Another object of the present invention to provide an apparatus and a method for manufacturing an absorption pad used for a semiconductor manufacturing process, capable of minimizing process time and manufacturing cost for the absorption pad by manufacturing the absorption pad in various patterns and sizes using a laser.

In order to accomplish the above object, according to one aspect of the present invention, there is provided an apparatus for manufacturing an absorption pad used for a semiconductor manufacturing process, the apparatus comprising: a workpiece transfer device on which a workpiece is mounted; a laser generator installed above the workpiece transfer device while being spaced apart from the workpiece transfer device by a predetermined distance; a driving unit for moving the workpiece transfer device and the laser generator relative to each other; and a controller for controlling the laser generator.

The controller is connected to the laser generator through a communication cable and includes a processing condition setting unit for establishing processing conditions for the workpiece and a processing program used for controlling the laser generator according to the processing conditions established by the processing condition setting unit.

The processing condition setting unit includes a pattern setting part for setting pattern information of the workpiece, a laser output setting part for setting information related to an intensity of a laser irradiated from a laser oscillator of the laser generator, and a processing information setting part for setting information related to a speed of the workpiece transfer device and a repetition number of laser irradiation.

The absorption pad manufacturing apparatus further includes a dust removal device for removing dust generated while the workpiece is being processed, wherein the dust removal device includes an air blower installed adjacent to the laser generator in order to spray high-pressure air toward the workpiece, a suction hood installed in opposition to the air blower so as to receive dust removed from the workpiece by means of the air sprayed from the air blower, and a dust collector for collecting dust discharged from the suction hood.

The workpiece transfer device is movable in X and Z-axis directions.

The laser generator repeatedly irradiates the laser onto the workpiece several times so as to form patterns having a predetermined depth on the workpiece or so as to form holes in the workpiece.

A pair of workpiece transfer devices are provided.

According to another aspect of the present invention, there is provided a method for manufacturing an absorption pad used for a semiconductor manufacturing process, the method comprising the steps of: setting processing conditions for a workpiece; aligning the workpiece relative to a laser generator; and irradiating a laser onto the workpiece according to the processing conditions, thereby forming desired patterns on the workpiece.

The step of setting the processing conditions includes the substeps of: setting pattern information including a size and a shape of the pattern to be formed on the workpiece; setting information related to an intensity of the laser; and setting processing information including a movement direction and a processing speed of a workpiece transfer device and a repetition number of laser irradiation.

In the step of forming the desired patterns on the workpiece, the laser generator repeatedly irradiates the laser onto the workpiece several times so as to form patterns having a predetermined depth on the workpiece or so as to form holes in the workpiece.

The current and the frequency of the laser vary depending on a material of the workpiece.

The laser includes a YAG laser.

The current is set to 38A, the frequency is set to 10000 Hz, and the processing speed is set in a range of 100 to 450 mm/sec.

In the step of setting the processing conditions, the processing conditions are automatically set according to the pattern information including the size, the shape and a processing depth of the pattern to be formed on the workpiece, by previously storing the processing information including an optimum intensity of the laser, and optimum movement direction and processing speed of the workpiece transfer device in a database based on the pattern information.

In the step of setting the processing conditions, the processing speed of the workpiece transfer device is automatically set according to the intensity of the laser by previously storing an optimum processing speed of the workpiece transfer device in a database based on the intensity of the laser.

The method further includes a step of forming a plurality of solder ball recesses along peripheral portions of the absorption pad after fabricating the absorption having the desired patterns by irradiating the laser onto the workpiece.

According to still another aspect of the present invention, there is provided a method for manufacturing an absorption pad used for a semiconductor manufacturing process, the method comprising the steps of: primarily processing a workpiece using a mechanical processing device including a mold; setting secondary processing conditions for the workpiece based on a state of the workpiece; aligning the workpiece, which has been primarily processed, relative to a laser generator; and irradiating a laser onto the workpiece according to the secondary processing conditions, thereby forming desired patterns on the workpiece.

The step of setting the secondary processing conditions includes the substeps of: setting pattern information including a size and a shape of the pattern to be formed on the workpiece; setting an intensity of the laser according to a material of the workpiece; and setting processing information including a processing speed of a workpiece transfer device and a repetition number of laser irradiation.

As described above, the apparatus and the method for manufacturing the absorption pad used for the semiconductor manufacturing process according to the present invention have advantages as follows:

First, the package absorption cavities, vacuum holes and recesses of the absorption pad can be precisely fabricated because they are formed by means of a laser. Thus, it is possible to enlarge the size of the package absorption cavities, in which the package is rested, within a maximum size thereof, so that the sawing machine used for sawing the package strip or the picker used for transferring individual packages to a relevant place can stably pick up the package strip or the individual packages by using a vacuum.

In addition, the absorption pad can be precisely fabricated in various patterns and sizes according to the purpose of use for the absorption pad and the size of the package, and the absorption pad can be standardized, so that the process time and manufacturing cost for the absorption pad can be minimized.

Furthermore, since optimum process conditions for the absorption pad can be stored in a database according to the purpose of use and the size of the absorption pad, it is possible to simply and effectively manufacture the absorption pad having the uniform size and pattern.

BRIEF DESCRIPTION OF THE DRAWINGS

FIG. 1 is a perspective view illustrating a conventional absorption pad used for a semiconductor manufacturing process;

FIG. 2 is a perspective view illustrating an apparatus for manufacturing an absorption pad used for a semiconductor manufacturing process according to one embodiment of the present invention;

FIG. 3 is a side view illustrating an apparatus for manufacturing an absorption pad shown in FIG. 2;

FIG. 4 is a block view illustrating the structure of a laser generator shown in FIG. 2;

FIG. 5 is a block view illustrating the structure of a controller shown in FIG. 2;

FIG. 6 is a flowchart illustrating the procedure for manufacturing an absorption pad used for a semiconductor manufacturing process by using an absorption pad manufacturing apparatus shown in FIG. 2;

FIG. 7 is a perspective view illustrating an absorption pad manufactured by an absorption pad manufacturing apparatus shown in FIG. 2;

FIG. 8 is a sectional view taken along line A-A shown in FIG. 7;

FIG. 9 is a perspective view illustrating an apparatus for manufacturing an absorption pad used for a semiconductor manufacturing process according to anther embodiment of the present invention;

FIG. 10 is a flowchart illustrating the procedure for manufacturing an absorption pad used for a semiconductor manufacturing process by using an absorption pad manufacturing apparatus shown in FIG. 9;

FIG. 11 is a perspective view illustrating an apparatus for manufacturing an absorption pad used for a semiconductor manufacturing process according to still anther embodiment of the present invention;

FIG. 12 is a flowchart illustrating the procedure for manufacturing an absorption pad used for a semiconductor manufacturing process;

FIG. 13 is a plan view illustrating an absorption pad manufactured according to the procedure shown in FIG. 12; and FIG. 14 is a partially enlarged perspective view of an absorption pad shown in FIG. 13.

DETAILED DESCRIPTION OF THE PREFERRED EMBODIMENTS

Hereinafter, an apparatus and a method for manufacturing an absorption pad used for a semiconductor manufacturing process according to the present invention will be described with reference to accompanying drawings.

FIG. 2 is a perspective view illustrating an apparatus for manufacturing an absorption pad used for a semiconductor manufacturing process according to one embodiment of the present invention, FIG. 3 is a side view of FIG. 2, and FIG. 4 is a block view illustrating the structure of a laser generator according to one embodiment of the present invention.

As shown in FIGS. 2 and 3, the apparatus for manufacturing the absorption pad used for the semiconductor manufacturing process mainly includes a workpiece transfer device 43, which is selectively movable in an X-axis direction, a Y-axis direction or a Z-axis direction and on which a workpiece 41 made of rubber, sponge or silicon is mounted, a laser generator 45 irradiating a laser onto the workpiece 41 so as to form a desired pattern on the workpiece 41, and a controller 61 (see, FIG. 5) for controlling the laser generator 45.

The workpiece 41 is a raw material for the absorption pad, which is attached to the workpiece transfer device 43 used for dicing a package strip into individual packages or attached to a picker used for transferring the individual packages. The workpiece 41 is made of rubber, such as natural rubber or elastomer. Preferably, the workpiece 41 is made of natural rubber, synthetic rubber, or elastic plastic (low-density polyethylene flexible vinyl chloride plastic). In addition, the workpiece 41 can be made of NBR (nitrile butadiene rubber), fluoro rubber, silicon rubber, or silicon foam rubber (silicon sponge). Sponge can also be used for the workpiece 41.

The apparatus for manufacturing the absorption pad used for the semiconductor manufacturing process also includes a first transfer unit for moving the workpiece transfer device 43 in a Y-axis direction, a second transfer unit for moving the workpiece transfer device 43 in an X-axis direction, and a third transfer unit for moving the workpiece transfer device 43 in a Z-axis direction.

As shown in FIGS. 2 and 3, the workpiece transfer device 43 is fixedly installed on a first transfer plate 49, which moves in the Y-axis direction along first guide rails 47 extending in the Y-axis direction. In addition, the first transfer plate 49 is fixedly installed on a second transfer plate 53, which moves in the X-axis direction along second guide rails 51 extending in the X-axis direction. Lower portions of the first and second transfer plates 49 and 53 are screw-coupled with ball screws (not shown) installed along the first and second guide rails 47 and 51, so that the first and second transfer plates 49 and 53 may move in the X and Y-axis directions, respectively, as the ball screws are rotated by means of a motor (not shown). That is, the first transfer unit consists of the first guide rails 47, the first transfer plate 49, and the ball screw, and the second transfer unit consists of the second guide rails 51, the second transfer plate 53 and the ball screw.

In addition, the workpiece transfer device 43 is movable in the Z-axis direction. Similar to the first and second transfer plates 49 and 53, the workpiece transfer device 43 is moved by means of the guide rails and the ball screw. Otherwise, a cylinder can be provided to move the workpiece transfer device 43. The movement mechanism for the workpiece transfer device 43 and the first and second transfer plates 49 and 53 can be variously established.

As shown in FIG. 4, the laser generator 45 includes a laser oscillator 45a for irradiating a laser so as to process the workpiece 41 under the control of the controller, and a reflecting mirror 45c for reflecting the laser irradiated from the laser oscillator 45a toward a processing head 45b aligned at a front upper end portion of the workpiece transfer device 43. In addition, a condenser lens 45d is accommodated in the processing head 45b so as to guide the laser onto the workpiece 41 by condensing the laser when the laser is introduced thereto from the reflecting mirror 45c.

The intensity of the laser (the current, the frequency, etc.) irradiated from the laser generator 45 can be various adjusted depending on the material and processing depth of the pattern formed on the workpiece 41. According to the present embodiment, a diode pumping type 10W YAG (yttrium aluminum garnet) laser having frequencies of about 150000 Hz is employed. The YAG laser is a solid-state laser, which is oscillated when light energy is applied to a rod, which is prepared by doping $Nd^{3+}$ onto YAG crystal, from a Xenon lamp.

The laser generator 45 can use a $CO_2$ gas laser instead of the YAG laser. The $CO_2$ gas laser uses $CO_2$ gas as a gain medium. The gain medium includes $N_2$ gas in addition to $CO_2$ gas. The $CO_2$ gas laser selectively employs optical pumping excitation or discharge excitation as an excitation scheme thereof. Besides above, various types of laser generators can be used in the present invention.

The controller for controlling the laser generator 45 includes a PC (personal computer), which is equipped with a processing program and makes communication with the laser generator 45. Preferably, the controller is connected to the laser generator 45 through various communication cables (RS-232C cables, LAN lines, etc.) such that the controller can control the laser generator 45 even in a remote place. In addition, the controller is also connected to a motor controller through a cable so as to control various motors and cylinders used for moving the first and second transfer plates 49 and 53 and the workpiece transfer device 43. Meanwhile, the controller can be designed such that it is directly attached to a panel of the laser generator 45.

As shown in FIG. 5, the controller 61 includes a processing condition setting unit 61a for establishing processing conditions. A processing program 61b is executed according to the processing conditions established by the processing condition setting unit 61a, thereby properly controlling the laser oscillator 45a according to the processing mechanism program.

The processing condition setting unit 61a includes a pattern setting part 63a, a laser output setting part 63b and a processing information setting part 63c. The pattern setting part 63a is used for setting pattern information, such as the size and shape of a pattern to be processed, the center of each package absorption section defined in the workpiece, the number of package absorption sections, the distance between package absorption sections, the number of package absorption groups having a plurality of package absorption sections, and the distance between the package absorption groups. The laser output setting part 63b is used for setting the intensity of the laser, such as the frequency, the current outputted from the laser oscillator 45a. The processing information setting part 63c is used for setting processing information, such as the repetition number of laser irradiation for specifying the processing depth of the pattern, the movement direction and speed of the workpiece transfer device 43, and the hatching degree (the degree of overlap between laser beam spots).

That is, the processing condition setting unit 61a establishes processing conditions required for processing the workpiece 41, such as information of the pattern to be processed, the intensity (the frequency, the current etc.) of the laser outputted from the laser oscillator 45a, and the speed of the workpiece transfer device 43, such that the workpiece 41 can be processed according to the processing conditions established by the processing condition setting unit 61a.

According to the present invention, it is also possible to design the pattern setting part 63a and the processing information setting part 63c of the processing condition setting unit 61a in such a manner that the pattern setting part 63a only sets pattern information, such as the size and shape of the pattern to be processed, and the processing information setting part 63c sets the center of each package absorption section defined in the workpiece, the number of package absorption sections, the distance between package absorption sections, the number of package absorption groups having a plurality of package absorption sections, and the distance between the package absorption groups as well as the processing information, such as the processing speed of the workpiece transfer device 43, the repetition number of laser irradiation for specifying the processing depth of the pattern, and the hatching degree.

Meanwhile, according to the present embodiment, two input sections are separately provided to allow the user to input information about the pattern of the workpiece and the processing mode for each pattern, respectively. However, it is also possible to input the information about the pattern of the workpiece and the processing mode for each pattern by using only one input section.

The above processing conditions are registered in a database, so that processing information, such as the intensity of the laser, the movement direction and speed of the workpiece transfer device 43, and the movement direction of the first and second transfer plates 49 and 53, can be automatically established in combination with the shape, the size and the processing depth of the pattern to be patterned on the workpiece 41. That is, the movement mechanism of the devices (workpiece transfer device, transfer plates, etc.) including the optimum intensity can be automatically established according to the processing conditions, so that it is not necessary to newly establish the intensity whenever the processing conditions change. In addition, it is possible to obtain high-quality absorption pads by standardizing the processing conditions. For instance, since the processing depth of the pattern is proportional to the repetition number of laser irradiation, if the worker wants to form the pattern having a predetermined depth on the workpiece, the worker calculates and stores the repetition number of laser irradiation corresponding to the predetermined depth of the pattern in such a manner that the repetition number of laser irradiation can be automatically established when forming the pattern on the workpiece.

According to the absorption pad manufacturing apparatus having the above structure, the workpiece 41 made of rubber, sponge or silicon is mounted on the workpiece transfer device 43, and then the processing condition is set (or, predetermined items are selected according to processing conditions). After that, the workpiece transfer device 43 is moved based on the vision inspection result so as to align the workpiece 41. In this state, the power is applied to the laser generator 45 so that the laser generator 45 irradiates the laser having the predetermined intensity. The laser irradiated from the laser generator 45 is reflected from the reflecting mirror 45c and guided onto the workpiece 41 through the condenser lens 45d of the processing head 45b, so that the workpiece 41 is processed according to the processing mechanism program.

At this time, since the laser has the high temperature, the surface of the workpiece 41 may be melted. In this case, the surface uniformity of the workpiece 41 is deteriorated. To solve the above problem, the present invention properly adjusts the intensity of the laser, the speed of the transfer plates and the number of laser irradiation by using the controller, thereby improving the surface uniformity of the workpiece 41. In addition, it is also possible to adjust the processing depth of the pattern by controlling the intensity of the laser and the number of laser irradiation using the controller.

Thus, the workpiece 41 can be precisely processed as compared with when the workpiece 41 is processed by using the mold. In addition, since the shape and size of the pattern to be processed and the processing depth of the pattern can be standardized, the absorption pads can be manufactured in mass-production.

Although the present embodiment has been described that the workpiece transfer device 43 is selectively moved in the X-axis direction, the Y-axis direction or the Z-axis direction while the laser generator 45 is being fixed, it is also possible to selectively move the laser generator 45 in the X-axis direction, the Y-axis direction or the Z-axis direction so as to process the workpiece 41 while the workpiece transfer device 43 is being fixed. In this case, a movement mechanism allowing the laser generator 45 to move in the X-axis direction, the Y-axis direction or the Z-axis direction must be provided. Such a movement mechanism can be constructed by using guide rails, ball screws and cylinders. The reason for moving the workpiece transfer device 43 in the Z-axis direction is to adjust the processing depth of the pattern and to correct the focus of the laser. However, actually, the processing depth of the pattern is very small, so there is no problem even if the workpiece transfer device 43 cannot move in the Z-axis direction.

Alternatively, the workpiece transfer device 43 moves in the X and Y-axis directions and the laser generator 45 moves in the Z-axis direction. The movement direction of the above elements can be variously modified.

Meanwhile, according to the present embodiment, the laser is irradiated from the laser generator 45 in the Y-axis direction within a predetermined range without moving the laser generator 45 and workpiece transfer device 43 in the Y-axis direction when processing the workpiece 41 (see, FIG. 11).

Hereinafter, the procedure for manufacturing the absorption pad by using the absorption pad manufacturing apparatus having the above structure according to the present invention will be described.

FIG. 6 is a flowchart illustrating the procedure for manufacturing the absorption pad used for the semiconductor manufacturing process by using the absorption pad manufacturing apparatus according to the present invention.

As shown in FIG. 6, the method for manufacturing the absorption pad according to the present invention mainly includes the steps of setting processing conditions for the workpiece 41 (S701), aligning the workpiece 41 made of rubber, silicon or sponge relative to the laser generator 45 (S702), and selectively irradiating the laser onto the workpiece 41 according to the process condition, thereby forming a desired pattern on the workpiece 41 (S703).

Step (S701) includes the substeps of setting pattern information, setting the intensity of the laser and setting processing information.

Pattern information is set during the substep of setting the pattern information, in which the pattern information includes the size, shape and processing depth of the pattern (herein, the pattern refers to a package absorption cavity for mounting the package thereon, a vacuum hole for making the package absorption cavity in a vacuum state, a blade receiving recess for receiving a part of the blade and a ball receiving recess for receiving a ball of a BGA package), the center of each package absorption section defined in the workpiece, the number of package absorption sections, the distance between package absorption sections, the number of package absorption groups having a plurality of package absorption sections, and the distance between the package absorption groups. The size and shape of the absorption pad used for picking up the package strip using a vacuum when the package strip is sawed in the sawing machine may be different from the size and shape of the absorption pad attached to the picker for transferring the package strip or individual package. Furthermore, the absorption pad used for the sawing machine may be different from the absorption pad attached to the picker according to the size of the package. Thus, the optimum processing condition for each package is established. For instance, in the case of the package having a large size, it is not necessary to precisely process the absorption pad, so the laser is irradiated only when forming the package absorption cavities and the remaining parts of the workpiece are formed through the grinding or molding process. In contrast, the package absorption cavities can be formed through the grinding or molding process while processing remaining parts of the workpiece by using the laser. In addition, in the case of the package having a small size, it is necessary to precisely process the absorption pad, so the package absorption cavities, an outer surface of the workpiece and an inner surface of the workpiece, into which a picker holder is inserted, are processed by using the laser.

The intensity of the laser irradiated from the laser oscillator 45a, that is, the current, the frequency etc. are set during the substep of setting the intensity of the laser. At this time, the intensity of the laser can be set by manually inputting the current, the frequency etc. of the laser using the input section, or the intensity of the laser can be automatically set based on the pattern information if data related to the intensity of the laser have been stored in the database corresponding to the material and pattern of the workpiece. Thus, the processing state of the workpiece can be adjusted by controlling the current and the frequency of the laser, so that the absorption pad can be precisely processed.

In addition, the repetition number of laser irradiation for specifying the processing depth of the pattern, the speed of the workpiece transfer device 43, and the hatching degree are set during the substep of setting processing information.

Step S702 is performed so as to align the workpiece 41 relative to the laser generator. In step S702, the workpiece 41 is aligned on the workpiece transfer device 43. For reference, the workpiece transfer device 43 returns to its initial position as the workpiece 41 has been completely processed in such a manner that another workpiece 41 can be consecutively processed.

Step 703 is performed in order to form the pattern on the workpiece by irradiating the laser onto the workpiece according to the processing conditions. At this time, the workpiece 41 is processed according to the processing information, such as the speed of the workpiece transfer device 43 and the repetition number of laser irradiation for specifying the processing depth of the pattern.

As mentioned above, the absorption pad is made of rubber, sponge or silicon, so the absorption pad may be easily burned if the intensity of the laser is too high. Thus, the laser having a relatively low intensity is repeatedly irradiated onto the workpiece several times when forming the pattern having a predetermined depth on the workpiece.

The process conditions are established prior to aligning the workpiece. That is, after irradiating the laser onto a processing area of the rubber pad or a non-processing area of the rubber pad according to the process conditions, the processing area or the non-processing area are inspected by using the vision inspection device, and then the processing area or the non-processing area are compared with fiducial marks, thereby compensating for the error value. In this case, the rubber pad can be manufactured while compensating for the error value thereof, so the precision degree of the rubber pad can be improved. In order to compensate for the error value, X and Y coordinate values of the laser generator 45 or the workpiece transfer device 43 can be corrected, or the X-Y coordinate values of the laser and workpiece transfer device can be corrected.

In contrast, the workpiece alignment step can be performed prior to establishing the process conditions. That is, if the reference marks have already been formed in the workpiece, the vision inspection device aligns the workpiece based on the fiducial marks while correcting the position of the workpiece. After that, the process conditions are established in order to process the workpiece.

Tables 1 to 9 are experimental data representing the state of the workpiece according to the frequency and processing speed when the current of the laser (YAG laser) is fixed to 38A. Table 1 to 3 present the state of the workpiece when rubber is used as the workpiece, Table 4 to 6 present the state of the workpiece when silicon is used as the workpiece, and Table 7 to 9 present the state of the workpiece when sponge is used as the workpiece. For reference, a mark "x" represents "rough", a mark "Δ" represents "slightly rough", a mark "○" represents "good" and a mark "⊙" represents "very good".

TABLE 1

| Material | Current (A) | Frequency (Hz) | Speed (mm/s) | Processing number | Depth (mm) | Time (sec) | State External appearance | State Bottom state | Workability |
|---|---|---|---|---|---|---|---|---|---|
| Rubber | 38 | 10000 | 50 | 3 | 0.20 | 66 | ○ | Δ | ○ |
|  |  |  |  | 6 | 0.41 | 124 | ○ | Δ | ○ |
|  |  |  |  | 9 | 0.62 | 191 | ○ | Δ | ○ |
|  |  |  | 100 | 3 | 0.06 | 41 | ○ | Δ | ○ |
|  |  |  |  | 6 | 0.13 | 78 | ○ | ○ | ○ |
|  |  |  |  | 9 | 0.18 | 115 | ○ | ○ | ○ |
|  |  |  | 150 | 3 | 0.05 | 21 | ○ | ○ | ○ |
|  |  |  |  | 6 | 0.11 | 40 | ○ | ○ | ○ |
|  |  |  |  | 9 | 0.14 | 61 | ○ | ○ | ○ |

TABLE 1-continued

| Material | Current (A) | Frequency (Hz) | Speed (mm/s) | Processing number | Depth (mm) | Time (sec) | State External appearance | State Bottom state | Workability |
|---|---|---|---|---|---|---|---|---|---|
| | | | 300 | 3 | 0.02 | 13 | ◎ | ◎ | ◎ |
| | | | | 6 | 0.04 | 25 | ◎ | ◎ | ◎ |
| | | | | 9 | 0.06 | 40 | ◎ | ◎ | ◎ |
| | | | 450 | 3 | 0.01 | 10 | ◎ | ◎ | ◎ |
| | | | | 6 | 0.02 | 19 | ◎ | ◎ | ○ |
| | | | | 9 | 0.03 | 28 | ◎ | ◎ | ○ |

Table 1 shows the state of the workpiece (rubber) according to the processing speed and processing number when the current and the frequency of the laser are fixed to 38A and 10000 Hz, respectively. According to Table 1, the state of the workpiece is generally improved as the processing speed increases when the current and the frequency of the laser are fixed to 38A and 10000 Hz, respectively. If the processing speed is equal to or exceeds 100 mm/sec, the external appearance, the bottom state, and the workability of the workpiece are generally improved. In addition, if the processing speed is equal to or exceeds 300 mm/sec, the external appearance, the bottom state, and the workability of the workpiece are greatly improved.

TABLE 2

| Material | Current (A) | Frequency (Hz) | Speed (mm/s) | Processing number | Depth (mm) | Time (sec) | State External appearance | State Bottom state | Workability |
|---|---|---|---|---|---|---|---|---|---|
| Rubber | 38 | 20000 | 50 | 3 | 0.54 | 66 | Δ | X | ○ |
| | | | | 6 | 1.08 | 126 | Δ | X | ○ |
| | | | | 9 | 1.64 | 190 | Δ | X | ○ |
| | | | 100 | 3 | 0.16 | 40 | Δ | X | ○ |
| | | | | 6 | 0.38 | 77 | Δ | X | ○ |
| | | | | 9 | 0.53 | 114 | Δ | X | ○ |
| | | | 150 | 3 | 0.13 | 22 | Δ | X | ○ |
| | | | | 6 | 0.26 | 40 | Δ | X | ○ |
| | | | | 9 | 0.38 | 62 | Δ | X | ○ |
| | | | 300 | 3 | 0.06 | 14 | ○ | X | ○ |
| | | | | 6 | 0.13 | 25 | ○ | X | ○ |
| | | | | 9 | 0.19 | 40 | ○ | X | ○ |
| | | | 450 | 3 | 0.03 | 11 | ○ | Δ | ○ |
| | | | | 6 | 0.06 | 19 | ○ | Δ | ○ |
| | | | | 9 | 0.09 | 27 | ○ | Δ | ○ |

Table 2 shows the state of the workpiece (rubber) according to the processing speed and processing number when the current and the frequency of the laser are fixed to 38A and 20000 Hz, respectively. According to Table 2, the state of the workpiece is generally improved as the processing speed increases when the current and the frequency of the laser are fixed to 38A and 20000 Hz, respectively. However, the bottom state of the workpiece is rough or slightly rough in general.

TABLE 3

| Material | Current (A) | Frequency (Hz) | Speed (mm/s) | Processing number | Depth (mm) | Time (sec) | State External appearance | State Bottom state | Workability |
|---|---|---|---|---|---|---|---|---|---|
| Rubber | 38 | 30000 | 50 | 3 | 0.90 | 65 | X | X | ○ |
| | | | | 6 | 1.80 | 125 | X | X | ○ |
| | | | | 9 | 2.65 | 189 | X | X | ○ |
| | | | 100 | 3 | 0.30 | 40 | Δ | X | ○ |
| | | | | 6 | 0.64 | 77 | Δ | X | ○ |
| | | | | 9 | 0.95 | 115 | Δ | X | ○ |

TABLE 3-continued

|  | | | | | | | State | | |
| Material | Current (A) | Frequency (Hz) | Speed (mm/s) | Processing number | Depth (mm) | Time (sec) | External appearance | Bottom state | Workability |
|---|---|---|---|---|---|---|---|---|---|
| | | | 150 | 3 | 0.21 | 22 | Δ | X | ○ |
| | | | | 6 | 0.43 | 41 | Δ | X | ○ |
| | | | | 9 | 0.65 | 61 | Δ | X | ○ |
| | | | 300 | 3 | 0.09 | 14 | ○ | X | ○ |
| | | | | 6 | 0.17 | 26 | ○ | X | ○ |
| | | | | 9 | 0.28 | 39 | ○ | X | ○ |
| | | | 450 | 3 | 0.06 | 10 | ○ | X | ○ |
| | | | | 6 | 0.11 | 18 | ○ | X | ○ |
| | | | | 9 | 0.14 | 27 | ○ | X | ○ |

Table 3 shows the state of the workpiece (rubber) according to the processing speed and processing number when the current and the frequency of the laser are fixed to 38A and 30000 Hz, respectively. According to Table 3, the state of the workpiece is generally improved as the processing speed increases when the current and the frequency of the laser are fixed to 38A and 30000 Hz, respectively. However, the bottom state of the workpiece is rough in general.

As can be understood from Tables 1 to 3, it is possible to manufacture the absorption pad having the high quality by increasing the processing speed if the current and the frequency of the laser are fixed to predetermined levels. When the current and the frequency of the laser are fixedly set to 38A and 10000 Hz, respectively, the state of the workpiece is generally improved. The state of the workpiece is remarkably improved if the processing speed is equal to or exceeds 300 mm/sec. In addition, if the frequency of the laser is increased in a range of 20000 to 30000 Hz, the bottom state of the workpiece is rough even if the processing speed is highly increased. Accordingly, when the workpiece is made of rubber, it is preferred to manufacture the workpiece with the processing speed of 300 mm/sec while setting the current and frequency of the laser to 38A and 10000 Hz, respectively.

TABLE 4

|  | | | | | | | State | | |
| Material | Current (A) | Frequency (Hz) | Speed (mm/s) | Processing number | Depth (mm) | Time (sec) | External appearance | Bottom state | Workability |
|---|---|---|---|---|---|---|---|---|---|
| Silicon | 38 | 10000 | 50 | 3 | 0.32 | 72 | ○ | Δ | ○ |
| | | | | 6 | 0.64 | 140 | ○ | Δ | ○ |
| | | | | 9 | 0.98 | 210 | ○ | X | ○ |
| | | | 100 | 3 | 0.13 | 41 | ⊙ | ○ | ○ |
| | | | | 6 | 0.27 | 77 | ⊙ | ○ | ○ |
| | | | | 9 | 0.39 | 114 | ⊙ | ○ | ○ |
| | | | 550 | 3 | 0.10 | 26 | ⊙ | ○ | ○ |
| | | | | 6 | 0.198 | 49 | ⊙ | ○ | ○ |
| | | | | 9 | 0.30 | 71 | ⊙ | ○ | ○ |
| | | | 300 | 3 | 0.07 | 13 | ⊙ | ⊙ | ⊙ |
| | | | | 6 | 0.13 | 26 | ⊙ | ⊙ | ⊙ |
| | | | | 9 | 0.23 | 37 | ⊙ | ⊙ | ⊙ |
| | | | 450 | 3 | 0.01 | 11 | ⊙ | ⊙ | ⊙ |
| | | | | 6 | 0.24 | 17 | ⊙ | ⊙ | ⊙ |
| | | | | 9 | 0.03 | 28 | ⊙ | ⊙ | ⊙ |

Table 4 shows the state of the workpiece (silicon) according to the processing speed and processing number when the current and the frequency of the laser are fixed to 38A and 10000 Hz, respectively. According to Table 4, the state of the workpiece is generally improved as the processing speed increases when the current and the frequency of the laser are fixed to 38A and 10000 Hz, respectively. If the processing-speed is equal to or exceeds 100 mm/sec, the external appearance, the bottom state, and the workability of the workpiece are generally improved. In addition, if the processing speed is equal to or exceeds 300 mm/sec, the external appearance, the bottom state, and the workability of the workpiece are greatly improved.

TABLE 5

| Material | Current (A) | Frequency (Hz) | Speed (mm/s) | Processing number | Depth (mm) | Time (sec) | State External appearance | Bottom state | Workability |
|---|---|---|---|---|---|---|---|---|---|
| Silicon | 38 | 20000 | 50 | 3 | 0.80 | 73 | ○ | X | ○ |
| | | | | 6 | 1.62 | 141 | ○ | X | ○ |
| | | | | 9 | 2.42 | 209 | Δ | X | ○ |
| | | | 100 | 3 | 0.32 | 42 | ○ | Δ | ○ |
| | | | | 6 | 0.65 | 77 | ○ | Δ | ○ |
| | | | | 9 | 0.95 | 115 | ○ | Δ | ○ |
| | | | 150 | 3 | 0.20 | 26 | ○ | Δ | ○ |
| | | | | 6 | 0.44 | 50 | ○ | Δ | ○ |
| | | | | 9 | 0.65 | 72 | ○ | Δ | ○ |
| | | | 300 | 3 | 0.10 | 15 | ○ | Δ | ○ |
| | | | | 6 | 0.21 | 26 | ○ | Δ | ○ |
| | | | | 9 | 0.31 | 38 | ○ | Δ | ○ |
| | | | 450 | 3 | 0.06 | 10 | ○ | ○ | ○ |
| | | | | 6 | 0.13 | 19 | ○ | ○ | ○ |
| | | | | 9 | 0.20 | 27 | ○ | ○ | ○ |

Table 5 shows the state of the workpiece (silicon) according to the processing speed and processing number when the current and the frequency of the laser are fixed to 38A and 20000 Hz, respectively. According to Table 5, the state of the workpiece is generally improved as the processing speed increases when the current and the frequency of the laser are fixed to 38A and 20000 Hz, respectively. However, although the external appearance and the workability of the workpiece are generally improved, the bottom state of the workpiece is rough in general if the processing speed is lower than 450 mm/sec.

TABLE 6

| Material | Current (A) | Frequency (Hz) | Speed (mm/s) | Processing number | Depth (mm) | Time (sec) | State External appearance | Bottom state | Workability |
|---|---|---|---|---|---|---|---|---|---|
| Silicon | 38 | 30000 | 50 | 3 | 1.12 | 72 | X | X | Δ |
| | | | | 6 | 2.23 | 140 | X | X | Δ |
| | | | | 9 | 3.36 | 210 | X | X | X |
| | | | 100 | 3 | 0.56 | 41 | Δ | Δ | ○ |
| | | | | 6 | 1.12 | 77 | Δ | Δ | ○ |
| | | | | 9 | 1.72 | 115 | Δ | Δ | ○ |
| | | | 150 | 3 | 0.35 | 28 | Δ | Δ | ○ |
| | | | | 6 | 0.69 | 49 | Δ | Δ | ○ |
| | | | | 9 | 1.03 | 71 | Δ | Δ | ○ |
| | | | 300 | 3 | 0.13 | 15 | Δ | Δ | Δ |
| | | | | 6 | 0.26 | 25 | Δ | Δ | Δ |
| | | | | 9 | 0.38 | 37 | Δ | Δ | Δ |
| | | | 450 | 3 | 0.09 | 13 | ○ | Δ | ○ |
| | | | | 6 | 0.19 | 18 | ○ | Δ | ○ |
| | | | | 9 | 0.28 | 28 | ○ | Δ | ○ |

Table 6 shows the state of the workpiece (silicon) according to the processing speed and processing number when the current and the frequency of the laser are fixed to 38A and 30000 Hz, respectively. According to Table 6, the state of the workpiece is generally improved as the processing speed increases when the current and the frequency of the laser are fixed to 38A and 30000 Hz, respectively. However, the external appearance, the bottom state and the workability of the workpiece are degraded in general.

As can be understood from Tables 4 to 6, it is possible to manufacture the absorption pad having the high quality by increasing the processing speed if the current and the frequency of the laser are fixed to predetermined levels. When the current and the frequency of the laser are fixedly set to 38A and 10000 Hz, respectively, the state of the workpiece is generally improved. The state of the workpiece is remarkably improved if the processing speed is equal to or exceeds 300 mm/sec. In addition, if the frequency of the laser is increased to 20000 Hz and the processing speed is lower than 450 mm/sec, the bottom state of the workpiece is rough in general. If the frequency of the laser is increased to 30000 Hz, the external appearance, the bottom state and the workability of the workpiece are generally degraded. Accordingly, when the workpiece is made of silicon, it is preferred to manufacture the workpiece with the processing speed of 300 to 450 mm/sec while setting the current and frequency of the laser to 38A and 10000 Hz, respectively.

TABLE 7

| Material | Current (A) | Frequency (Hz) | Speed (mm/s) | Processing number | Depth (mm) | Time (sec) | State External appearance | State Bottom state | Workability |
|---|---|---|---|---|---|---|---|---|---|
| Sponge | 38 | 10000 | 50 | 3 | 0.36 | 70 | ○ | ○ | ○ |
|  |  |  |  | 6 | 0.72 | 136 | ○ | ○ | ○ |
|  |  |  |  | 9 | 1.09 | 201 | ○ | △ | ○ |
|  |  |  | 100 | 3 | 0.17 | 37 | ◎ | ◎ | ◎ |
|  |  |  |  | 6 | 0.33 | 68 | ◎ | ◎ | ◎ |
|  |  |  |  | 9 | 0.50 | 100 | ◎ | ◎ | ◎ |
|  |  |  | 150 | 3 | 0.08 | 25 | ◎ | ◎ | ◎ |
|  |  |  |  | 6 | 0.15 | 47 | ◎ | ◎ | ◎ |
|  |  |  |  | 9 | 0.24 | 71 | ◎ | ◎ | ◎ |
|  |  |  | 300 | 3 | 0.04 | 15 | ◎ | ◎ | ○ |
|  |  |  |  | 6 | 0.08 | 26 | ◎ | ◎ | ○ |
|  |  |  |  | 9 | 0.12 | 39 | ◎ | ◎ | ○ |
|  |  |  | 450 | 3 | 0.03 | 12 | ◎ | ◎ | ○ |
|  |  |  |  | 6 | 0.07 | 22 | ◎ | ◎ | ○ |
|  |  |  |  | 9 | 0.11 | 32 | ◎ | ◎ | ○ |

Table 7 shows the state of the workpiece (sponge) according to the processing speed and processing number when the current and the frequency of the laser are fixed to 38A and 10000 Hz, respectively. According to Table 7, if the processing speed is equal to or exceeds 100 mm/sec when the current and the frequency of the laser are fixed to 38A and 10000 Hz, respectively, the external appearance, the bottom state, and the workability of the workpiece are generally improved.

TABLE 8

| Material | Current (A) | Frequency (Hz) | Speed (mm/s) | Processing Number | Depth (mm) | Time (sec) | State External appearance | State Bottom state | Workability |
|---|---|---|---|---|---|---|---|---|---|
| Sponge | 38 | 20000 | 50 | 3 | 0.97 | 70 | △ | X | △ |
|  |  |  |  | 6 | 1.94 | 135 | △ | X | △ |
|  |  |  |  | 9 | 2.92 | 198 | △ | X | △ |
|  |  |  | 100 | 3 | 0.43 | 36 | △ | X | ○ |
|  |  |  |  | 6 | 0.86 | 68 | △ | X | ○ |
|  |  |  |  | 9 | 1.30 | 98 | △ | X | ○ |
|  |  |  | 150 | 3 | 0.21 | 28 | ○ | △ | ○ |
|  |  |  |  | 6 | 0.42 | 49 | ○ | △ | ○ |
|  |  |  |  | 9 | 0.63 | 69 | ○ | △ | ○ |
|  |  |  | 300 | 3 | 0.12 | 15 | ◎ | ○ | ○ |
|  |  |  |  | 6 | 0.24 | 28 | ◎ | ○ | ○ |
|  |  |  |  | 9 | 0.32 | 41 | ◎ | ○ | ○ |
|  |  |  | 450 | 3 | 0.04 | 12 | ◎ | ○ | ○ |
|  |  |  |  | 6 | 0.09 | 22 | ◎ | ○ | ○ |
|  |  |  |  | 9 | 0.15 | 31 | ◎ | ○ | ○ |

Table 8 shows the state of the workpiece (sponge) according to the processing speed and processing number when the current and the frequency of the laser are fixed to 38A and 20000 Hz, respectively. According to Table 8, if the processing speed is equal to or exceeds 300 mm/sec when the current and the frequency of the laser are fixed to 38A and 20000 Hz, respectively, the external appearance of the workpiece is remarkably improved and the bottom state and the workability of the workpiece are generally improved.

TABLE 9

| Material | Current (A) | Frequency (Hz) | Speed (mm/s) | Processing number | Depth (mm) | Time (sec) | State External appearance | State Bottom state | Workability |
| --- | --- | --- | --- | --- | --- | --- | --- | --- | --- |
| Sponge | 38 | 30000 | 50 | 3 | 1.07 | 70 | X | X | Δ |
|  |  |  |  | 6 | 2.13 | 136 | X | X | Δ |
|  |  |  |  | 9 | 3.20 | 200 | X | X | X |
|  |  |  | 100 | 3 | 0.56 | 35 | X | X | Δ |
|  |  |  |  | 6 | 1.11 | 67 | X | X | Δ |
|  |  |  |  | 9 | 1.68 | 100 | X | X | Δ |
|  |  |  | 150 | 3 | 0.36 | 26 | Δ | X | ○ |
|  |  |  |  | 6 | 0.73 | 48 | Δ | X | ○ |
|  |  |  |  | 9 | 1.10 | 70 | Δ | X | ○ |
|  |  |  | 300 | 3 | 0.15 | 13 | ○ | Δ | ○ |
|  |  |  |  | 6 | 0.30 | 27 | ○ | Δ | ○ |
|  |  |  |  | 9 | 0.46 | 40 | ○ | Δ | ○ |
|  |  |  | 450 | 3 | 0.09 | 12 | ⊚ | ○ | ○ |
|  |  |  |  | 6 | 0.20 | 22 | ⊚ | ○ | ○ |
|  |  |  |  | 9 | 0.31 | 31 | ⊚ | ○ | ○ |

Table 9 shows the state of the workpiece (sponge) according to the processing speed and processing number when the current and the frequency of the laser are fixed to 38A and 30000 Hz, respectively. According to Table 7, the state of the workpiece is generally degraded when the current and the frequency of the laser are fixed to 38A and 30000 Hz, respectively. However, the external appearance of the workpiece is remarkably improved, and the bottom state and the workability of the workpiece are generally improved when the processing speed is equal to or exceeds 450 mm/sec.

As can be understood from Tables 7 to 9, it is possible to manufacture the absorption pad having the high quality by increasing the processing speed if the current and the frequency of the laser are fixed to predetermined levels. When the current and the frequency of the laser are fixedly set to 38A and 10000 Hz, respectively, the state of the workpiece is generally improved. The state of the workpiece is remarkably improved if the processing speed is equal to or exceeds 100 mm/sec. In addition, if the frequency of the laser is increased to 20000 Hz and the processing speed is equal to or lower than 350 mm/sec, the external appearance and the bottom state of the workpiece is rough in general. If the frequency of the laser is increased to 30000 Hz and the processing speed is lower than 450 mm/sec, the external appearance, the bottom state and the workability of the workpiece are generally degraded. Accordingly, when the workpiece is made of sponge, it is preferred to manufacture the workpiece with the processing speed of 100 to 150 mm/sec while setting the current and frequency of the laser to 38A and 10000 Hz, respectively.

In practice, the worker can properly select the processing conditions within the range of the processing conditions shown in Table 1 to 9. As shown in the Tables, the optimum processing speed may vary depending on the current and the frequency of the laser. Thus, if the optimum processing speed of the workpiece transfer device is previously stored in the database based on the output parameters of the laser, the processing speed of the workpiece transfer device can be automatically established according to the output parameters of the laser.

Meanwhile, the current, the frequency and the processing speed of the laser may vary depending on the types of the workpiece and the laser. That is, apparatuses for manufacturing absorption pad using the laser may be included within the scope of the present invention. In addition, although the experiment of the present embodiment has been performed under the conditions of the current of 38A and the frequency of 10000 to 30000 Hz, the experiment can be performed with various combinations of the current, the frequency and the processing speed. For example, the experiment can be performed under the conditions of the current higher than or lower than 38A, the frequency higher than 30000 Hz or lower than 10000 Hz, and the processing speed equal to or higher than 450 mm/sec.

FIG. 7 is a perspective view illustrating the absorption pad manufactured by the absorption pad manufacturing apparatus according to one embodiment of the present invention, and FIG. 8 is a sectional view of the absorption pad taken along line A-A shown in FIG. 7.

As shown in FIGS. 7 and 8, the absorption pad includes a plurality of package absorption cavities 11 in the form of a matrix, vacuum holes 13 formed at the center portions of the package absorption cavities 11, and recesses 15 formed at peripheral portions of the package absorption cavities 11 in order to receive blades when dicing the package strip into individual packages using the blades. If the vacuum holes 13, the package absorption cavities 11, and the recesses 15 are formed by using the laser, they can be precisely formed as compared with when they are formed in the mold. Accordingly, a distance (t) between the package absorption cavity 11 and the recess 15 can be narrowed, so that the area of the absorption cavity 11 can be enlarged. If the area of the absorption cavity 11 is enlarged, the absorption cavity 11 can stably pick up the absorption pad by using the vacuum. This may not be achieved if the vacuum holes 13, the package absorption cavities 11, and the recesses 15 are formed by means of the mold.

In general, the sequence of forming the vacuum holes 13, the package absorption cavities 11, and the recesses 15 is not fixed. Preferably, after forming the package absorption cavities by processing a predetermined area of the workpiece 41, the vacuum holes are formed at the center portions of the package absorption cavities while increasing the intensity of the laser or approaching the workpiece transfer device 43 to the laser generator 45, and then the recesses 15 are formed around the package absorption cavities.

FIG. 9 is a perspective view illustrating an apparatus for manufacturing an absorption pad used for a semiconductor manufacturing process according to anther embodiment of the present invention.

The structure and the operation of the absorption pad manufacturing apparatus according to anther embodiment of the present invention are basically similar to those of the absorption pad manufacturing apparatus shown in FIG. 2, except that the absorption pad manufacturing apparatus according to anther embodiment of the present invention further includes a dust removal device and the elements of the absorption pad manufacturing apparatus according to another embodiment of the present invention are shown in detail.

As shown in FIG. 9, the absorption pad manufacturing apparatus according to anther embodiment of the present invention mainly includes a workpiece transfer device 70 on which the workpiece is mounted, a laser generator for irradiating the laser toward the workpiece so as to form a desired pattern on the workpiece, a controller for controlling the laser generator, and a dust removal device for removing dust generated when processing the workpiece. In addition, a vision inspection device is installed above the movement path of the workpiece transfer device so as to properly align the workpiece.

The laser generator includes a laser body 71 and a laser head 72. Similar to the controller according to one embodiment of the present invention, the controller (not shown) according to another embodiment of the present invention includes a process condition setting unit and a processing program is executed according to the processing conditions established by the processing condition setting unit, thereby properly controlling the laser oscillator according to the processing mechanism program.

The dust removal device includes an air blower 73 for spraying high-pressure air toward the workpiece, a suction hood 74 installed in opposition to the air blower 73 so as to receive dust removed from the workpiece by means of the air sprayed from the air blower 73, and a dust collector 76 for collecting dust discharged from the suction hood 74. In addition, an air pump 77 and a hood 78 are connected to the dust collector 76 and a suction hose 75 is installed between the suction hood 74 and the dust collector 76.

FIG. 10 is a flowchart illustrating the procedure for manufacturing the absorption pad by using the absorption pad manufacturing apparatus shown in FIG. 9.

As shown in FIG. 10, processing conditions, such as the intensity of the laser irradiated from the laser generator, the speed of the workpiece transfer device 70 and the repetition number of laser irradiation, are set according to pattern information, such as the material of the workpiece, and/or the size and the shape of the pattern to be formed on the workpiece (S801). Then, the workpiece transfer device 70, on which the workpiece is mounted, is moved in the X-axis direction. At this time, the vision inspection device 79 inspects the alignment state of the workpiece and then the workpiece transfer device 70 is positioned below the laser head 72 (S802). When the workpiece transfer device 70 is positioned below the laser head 72, the laser head 72 irradiates the laser onto the workpiece so as to form the desired pattern on the workpiece (S803). At this time, dust generated from the workpiece is introduced into the suction hood 74 by means of air sprayed from the air blower 73 and is collected in the dust collector 76 through the suction hose 75. The dust is filtered while air containing the dust is passing through a filter (not shown) installed in the dust collector 76 so that clean air is introduced into the air pump 77 and is discharged to the exterior through the hood 78 (S804).

FIG. 11 is a perspective view illustrating an apparatus for manufacturing an absorption pad used for a semiconductor manufacturing process according to still anther embodiment of the present invention.

The structure and operation of the absorption pad manufacturing apparatus according to still anther embodiment of the present invention are basically similar to those of the absorption pad manufacturing apparatus shown in FIG. 9, except that the absorption pad manufacturing apparatus according to still anther embodiment of the present invention includes a pair of workpiece transfer devices 70 so as to improve the processing efficiency of the workpiece. In addition, the absorption pad manufacturing apparatus according to still anther embodiment of the present invention further includes an air pump 81 installed between the suction hose 75 and the dust collector 76 in order to effectively remove dust.

FIG. 12 is a flowchart illustrating the procedure for manufacturing the absorption pad used for the semiconductor manufacturing process according to still anther embodiment of the present invention.

According to the present embodiment, the pattern is formed on the absorption pad by means of both a mechanical processing device and a laser processing device.

As shown in FIG. 12, the method for manufacturing the absorption pad according to still anther embodiment of the present invention includes the steps of primarily processing the workpiece by using the mechanical processing device, such as a mold (S901), establishing secondary processing conditions by taking the state of the workpiece into consideration (S902), mounting the workpiece, which has been primarily processed, on the workpiece transfer device 70 (S903), aligning the workpiece using the vision inspection device 79 (S904), transferring the workpiece to a position below the laser generator (S905), and secondarily processing the workpiece by irradiating the laser onto the workpiece according to the secondary processing conditions, thereby forming the desired pattern on the workpiece (S906).

Herein, step 902 includes the substeps of setting pattern information, such as the size and the shape of the pattern to be formed on the workpiece, setting the intensity of the laser according to the state of the workpiece or the pattern information, and setting processing information, such as the movement direction and speed of the workpiece transfer device and the repetition number of laser irradiation.

FIG. 13 is a plan view illustrating the absorption pad manufactured according to the procedure shown in FIG. 12 and FIG. 14 is a partially enlarged perspective view of the absorption pad shown in FIG. 13.

In order to manufacture the absorption pad shown in FIGS. 13 and 14, the absorption pad manufacturing procedure shown in FIG. 12 is employed, in which vacuum holes 13 are formed by means of the mechanical processing device, such as the mold, and solder ball recesses 91 aligned around the vacuum holes 13 are formed by means of the laser processing device.

That is, after forming the vacuum holes 13 having rectangular shapes (illustrative purpose only, the shape of the vacuum hole is not limited thereto) on the workpiece made of rubber, etc. through the molding process, the solder ball recesses 91 having circular shapes are formed around the vacuum holes 13 by using the laser generator in such a manner that solder balls of the package can be aligned around the vacuum holes 13. Since the vacuum holes 13 extend while passing through the absorption pad, the vacuum holes 13 are preferably formed by means of the mold. In addition, since the solder ball recesses 91 must be precisely formed, the laser processing device is employed when forming the solder ball recesses 91. In this case, the processing time required for forming the pattern of the absorption pad can be significantly reduced while improving the quality of the absorption pad in view of precision.

Preferably, the solder ball recesses 91 are formed with the processing speed of 300 mm/sec while setting the current and the frequency to 38A and 10000 Hz, respectively. In this case, the external appearance and the bottom state of the solder ball recesses 91 are remarkably improved. However, the above processing conditions may be changed depending on the material of the workpiece.

In addition, it is also possible to primarily form some patterns using the laser processing device and then secondarily form remaining patterns using the mechanical processing device, such as the mold.

While this invention has been described in connection with what is presently considered to be the most practical and preferred embodiment, it is to be understood that the invention is not limited to the disclosed embodiment and the drawings, but, on the contrary, it is intended to cover various modifications and variations within the spirit and scope of the appended claims.

For instance, the present invention can be used for manufacturing a strip picker for transferring the strip or a package picker for picking up individual packages at a time or one by one.

As can be seen from the foregoing, the present invention is applicable for manufacturing the absorption pad used for the sawing machine. In addition, the method and the apparatus of the present invention are applicable for semiconductor package Pick & Place equipment and various semiconductor manufacturing devices using the absorption pad.

What is claimed is:

1. A method for manufacturing an absorption pad used for a semiconductor manufacturing process, the method comprising the steps of:
    setting pattern information on the workpiece, the pattern information including size, shape and processing depth of a package absorption cavity corresponding to an individual package on the package strip and a vacuum hole formed in the package absorption cavity, and an interval between the vacuum holes;
    setting information related to intensity of a laser;
    setting processing information including speed of a workpiece transfer device and the repetition number of laser irradiation,
    aligning the workpiece relative to a laser generator; and
    irradiating the laser onto the workpiece according to the processing conditions, thereby forming desired patterns on the workpiece.

2. The method as claimed in claim 1, wherein, in the step of forming the desired patterns on the workpiece, the laser generator repeatedly irradiates the laser onto the workpiece several times so as to form patterns having a predetermined depth on the workpiece or so as to form holes in the workpiece.

3. The method as claimed in claim 2, wherein a current and a frequency of the laser vary depending on a material of the workpiece.

4. The method as claimed in claim 3, wherein the laser includes a YAG laser.

5. The method as claimed in claim 3, wherein the current is set to 38A, the frequency is set to 10000 Hz, and the processing speed is set in a range of 100 to 450 mm/sec.

6. The method as claimed in claim 1, wherein, in the step of setting the processing conditions, the processing conditions are automatically set according to the pattern information including the size, the shape and a processing depth of the pattern to be formed on the workpiece, by previously storing the processing information including an optimum intensity of the laser, and optimum movement direction and processing speed of the workpiece transfer device in a database based on the pattern information.

7. The method as claimed in claim 1, wherein, in the step of setting the processing conditions, the processing speed of the workpiece transfer device is automatically set according to the intensity of the laser by previously storing an optimum processing speed of the workpiece transfer device in a database based on the intensity of the laser.

8. The method as claimed in claim 1, further comprising a step of forming a plurality of solder ball recesses along peripheral portions of the absorption pad after fabricating the absorption having the desired patterns by irradiating the laser onto the workpiece.

9. A method for manufacturing an absorption pad used for a semiconductor manufacturing process, the method comprising the steps of:
    primarily processing a workpiece using a mechanical processing device including a mold, the workpiece which is the material of the absorption pad for absorbing a package strip,
    setting secondary processing conditions for the workpiece based on a state of the workpiece;
    aligning the workpiece, which has been primarily processed, relative to a laser generator; and
    irradiating a laser onto the workpiece according to the secondary processing conditions, thereby forming desired patterns on the workpiece,
    wherein the step of setting the secondary processing conditions includes the substeps of:
    setting pattern information including size, shape and processing depth of a package absorption cavity corresponding to an individual package on the package strip and a vacuum hole formed in the package absorption cavity, and an interval between the vacuum holes,
    setting intensity of the laser according to a material of the workpiece, and
    setting processing information including speed of a workpiece transfer device and the repetition number of laser irradiation.

* * * * *